United States Patent
Hsu et al.

(10) Patent No.: US 12,381,331 B2
(45) Date of Patent: Aug. 5, 2025

(54) ELECTRONIC DEVICE

(71) Applicant: Advanced Semiconductor Engineering, Inc., Kaohsiung (TW)

(72) Inventors: Shao-En Hsu, Kaohsiung (TW); Huei-Shyong Cho, Kaohsiung (TW); Shih-Wen Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 106 days.

(21) Appl. No.: 18/108,498

(22) Filed: Feb. 10, 2023

(65) Prior Publication Data

US 2024/0275061 A1  Aug. 15, 2024

(51) Int. Cl.
| | |
|---|---|
| *H01Q 13/10* | (2006.01) |
| *H01P 3/08* | (2006.01) |
| *H05K 1/02* | (2006.01) |
| *H05K 1/11* | (2006.01) |

(52) U.S. Cl.
CPC ............. *H01Q 13/10* (2013.01); *H01P 3/08* (2013.01); *H05K 1/0243* (2013.01); *H05K 1/115* (2013.01); *H05K 2201/10098* (2013.01)

(58) Field of Classification Search
CPC ........ H01Q 13/10; H01P 3/08; H05K 1/0243; H05K 1/115; H05K 2201/10098
See application file for complete search history.

(56) References Cited

U.S. PATENT DOCUMENTS

| | | | |
|---|---|---|---|
| 2012/0093041 A1* | 4/2012 | Takeda ...................... | H01P 1/06 455/90.3 |
| 2021/0408655 A1* | 12/2021 | Prabhu Gaunkar ..... | H01P 5/028 |
| 2022/0336384 A1* | 10/2022 | Chen ................... | H01L 21/4857 |

FOREIGN PATENT DOCUMENTS

| | | |
|---|---|---|
| CN | 110931941 A | 3/2020 |
| CN | 113615004 A | 11/2021 |
| CN | 115579636 A | 1/2023 |

OTHER PUBLICATIONS

Non-Final Office Action on U.S. Appl. No. 18/108,489 DTD Mar. 6, 2025.

* cited by examiner

*Primary Examiner* — David E Lotter
(74) *Attorney, Agent, or Firm* — FOLEY & LARDNER LLP

(57) ABSTRACT

The present disclosure provides an electronic device. The electronic device includes a radio frequency (RF) circuit region and an antenna region. The RF circuit region has a first circuit density. The antenna region includes a circuit structure. The circuit structure defines a waveguide. The circuit structure has a second circuit density less than the first circuit density.

19 Claims, 10 Drawing Sheets

ELECTRONIC DEVICE

BACKGROUND

1. Field of the Disclosure

The present disclosure generally relates to an electronic device, in particular to an electronic device including an adjustable waveguide.

2. Description of the Related Art

To reduce size and improve integration of electronic device packages, several packaging solutions, such as antenna in package (AiP) and antenna on package (AoP) have been developed and implemented.

However, to support industry demand for increased electronic functionality, the size and/or form factor of electronic device packages is increased commensurately, clearly limiting functionality of some applications (e.g., device portability).

SUMMARY

In some embodiments, an electronic device includes a radio frequency (RF) circuit region and an antenna region. The RF circuit region has a first circuit density. The antenna region includes a circuit structure. The circuit structure defines a waveguide. The circuit structure has a second circuit density less than the first circuit density.

In some embodiments, an electronic device includes a radio frequency (RF) circuit region an antenna region. The RF circuit region has a first conductive element. The antenna region has a waveguide, a second conductive element disposed within the waveguide and connected to the first conductive element, and an impedance matching element configured to compensate a mismatch of impedances caused by the first conductive element and the second conductive element.

In some embodiments, an electronic device includes a circuit structure and an electronic component. The circuit structure includes an antenna, a high-density circuit and a low-density circuit. The electronic component is disposed over the circuit structure and configured to provide a radio frequency (RF) signal to the antenna through the high-density circuit and the low-density circuit.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
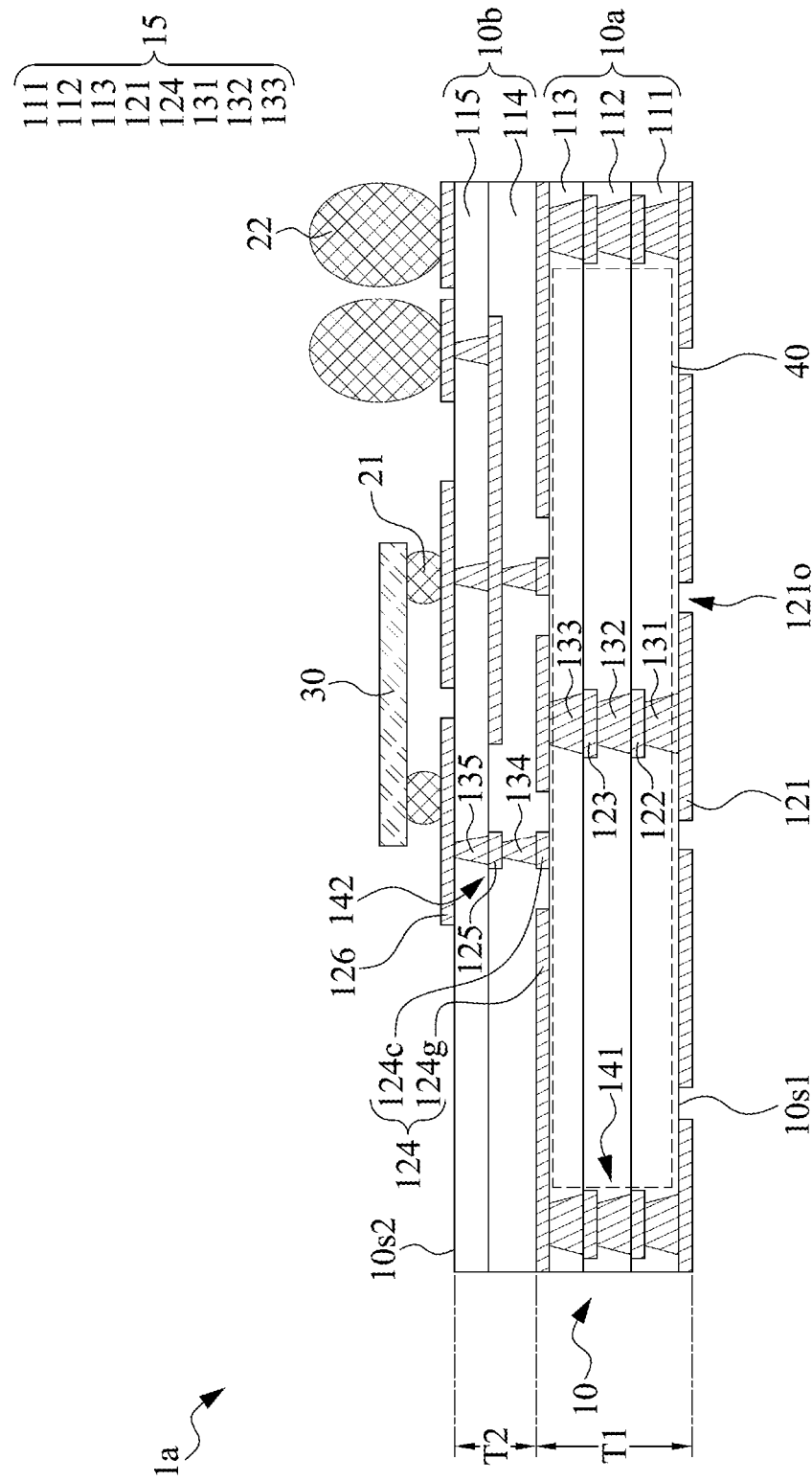
FIG. 1A is a cross-sectional view of an electronic device, in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a cross-sectional view of an electronic device 1a, in accordance with an embodiment of the present disclosure. In some embodiments, the electronic device 1a may be applicable to, for example, a wireless device, such as user equipment (UE), a mobile station, a mobile device, an apparatus communicating with the Internet of Things (IoT), etc. In some embodiments, the electronic device 1a may be or include a portable device. In some embodiments, the electronic device 1a may support fifth generation (5G) communications, such as Sub-6 GHz frequency bands and/or millimeter (mm) wave frequency bands. For example, the electronic device 1a may incorporate both Sub-6 GHz devices and mm wave devices. In some embodiments, the electronic device 1a may support beyond-5G or 6G communications, such as terahertz (THz) frequency. The electronic device 1a may be configured to radiate and/or receive electromagnetic signals, such as radio frequency (RF) signals. For example, the electronic device 1a may be configured to operate in a frequency between about 10 GHz and about 10 THz, such as 10 GHz, 20 GHz, 30 GHz, 40 GHz, 50 GHz, 100 GHz, 300 GHz, 1 THz, 5 THz, or 10 THz.

In some embodiments, the electronic device 1a may include a carrier 10, electrical connections 21, electrical connections 22, an electronic component 30, and a waveguide 40.

In some embodiments, the carrier 10 may include a plurality of dielectric layers with different dimensions (e.g., profiles, areas, lengths, widths, apertures and/or diameters) and a plurality of conductive elements with different dimensions. The carrier 10 may be or include, for example, a substrate. In some embodiments, the carrier 10 may include, for example, a printed circuit board (PCB), such as a paper-based copper foil laminate, a composite copper foil laminate, or a polymer-impregnated glass-fiber-based copper foil laminate.

In some embodiments, the electronic device 1a may include an antenna circuit region 10a (or antenna region) and a radio frequency (RF) circuit region 10b over the antenna circuit region 10a. The carrier 10 may include a surface 10s1 and a surface 10s2 opposite to the surface 10s1.

In some embodiments, the antenna circuit region 10a may be configured to receive a signal (e.g., a feed signal) from the RF circuit region 10b. In some embodiments, the antenna circuit region 10a may function as a part of an electromagnetic resonator. The antenna circuit region 10a may include dielectric layers 111, 112, and 113. The antenna circuit region 10a may include conductive traces 121, 122, 123, and 124. The antenna circuit region 10a may include conductive vias 131, 132, and 133.

In some embodiments, each of the dielectric layers 111, 112, and 113 may have a relatively large dielectric constant (dk). The dielectric layer 111 may serve as the bottommost layer of the carrier 10. The lower surface (not annotated) of the dielectric layer 111 may be defined as the surface 10s1 of the carrier 10. The dielectric layer 112 may be disposed over the dielectric layer 111. The dielectric layer 113 may be disposed over the dielectric layer 112. In some embodiments, the material of the dielectric layers 111, 112, and 113 may include, for example, polypropylene (PP) or other suitable materials. In some embodiments, the dielectric layers 111, 112, and 123 may have the same thickness. In some embodiments, the dielectric layers 111, 112, and 123 may have the different thicknesses.

In some embodiments, the conductive trace 121 may be disposed over the surface 10s1 of the carrier 10. In some embodiments, the conductive trace 121 may be disposed over the lower surface of the dielectric layer 111. In some embodiments, the conductive trace 121 may define a plurality of slots 121o. The slots 121o may function as a part of an electromagnetic resonator, which results in equivalent surface magnetic currents along or across the slots 121o. The slots 121o may function as a part of the waveguide 40, such as a slot antenna which includes the conductive trace 121 and slots 121o. In some embodiments, the slots 121o may function at least a part of an antenna.

The conductive trace 122 may be disposed over the conductive trace 121. The conductive trace 122 may be disposed over the conductive via 131. The conductive trace 122 may be disposed within the dielectric layer 111. The conductive trace 123 may be disposed over the conductive trace 122. The conductive trace 123 may be disposed over the conductive via 132. The conductive trace 123 may be disposed within the dielectric layer 112. The conductive trace 124 may be disposed over the conductive trace 123. The conductive trace 124 may be disposed over the conductive via 133. In some embodiments, the conductive trace 124 may include a layer 124g and a layer 124c. The layer 124g may be spaced apart from the layer 124c. The layer 124g may be electrically isolated from the layer 124c. In some embodiments, the layer 124g may function as a grounding layer, which may electrically connect to real ground or virtual ground. In some embodiments, the layer 124g may be configured to transmit a signal, such as a feed signal, or configured to serve as a part of an exciter of the waveguide.

The conductive via 131 may be disposed over the conductive trace 121. The conductive via 131 may be disposed within and/or penetrate the dielectric layer 111. The conductive via 132 may be disposed over the conductive trace 122. The conductive via 132 may be disposed within and/or penetrate the dielectric layer 112. The conductive via 133 may be disposed over the conductive trace 123. The conductive via 133 may be disposed within and/or penetrate the dielectric layer 113. In some embodiments, each of the conductive vias 131, 132, and 133 may taper toward the surface 10s2 of the carrier 10.

In some embodiments, the RF circuit region 10b may be configured to transmit a signal (e.g., a feed signal) to the antenna circuit region 10a. In some embodiments, the RF circuit region 10b may be configured to receive a signal (e.g., a feed signal) from the electronic component 30. The RF circuit region 10b may include dielectric layers 114 and 115. The RF circuit region 10b may include conductive traces 125 and 126. The RF circuit region 10b may include conductive vias 134 and 135.

In some embodiments, each of the dielectric layers 114 and 115 may have a relatively small dk. The dielectric layer 114 may be disposed over the dielectric layer 113. The dielectric layer 114 may be disposed over the conductive trace 124. The dielectric layer 115 may serve as the topmost layer of the carrier 10. The upper surface (not annotated) of the dielectric layer 115 may be defined as the surface 10s2 of the carrier 10. In some embodiments, the material of the dielectric layers 114 and 115 may include, for example, polyimide (PI) or other suitable materials.

In some embodiments, the conductive trace 125 may be disposed over the conductive trace 124. The conductive trace 125 may be disposed within the dielectric layer 114. The conductive trace 126 may be disposed over the conductive trace 125. The conductive trace 126 may be disposed over the surface 10s2 of the carrier 10. In some embodiments, each of the conductive traces 121, 122, 123, 124, 125, and 126 may be located at different levels or elevations.

The conductive via 134 may be disposed over the conductive trace 124. The conductive via 134 may be disposed within and/or penetrate the dielectric layer 114. The conductive via 135 may be disposed over the conductive trace 125. The conductive via 135 may be disposed within and/or penetrate the dielectric layer 115. In some embodiments, each of the conductive via 134 and 135 may taper toward the surface 10s2 of the carrier 10.

The electronic device 1a may include stacked conductive structures 141. In some embodiments, the stacked conductive structure 141 may be disposed within the antenna circuit region 10a. The stacked conductive structure 141 may include the conductive vias 131, 132, 133 as well as the conductive traces 122 and 123. In some embodiments, the stacked conductive structure 141 may serve as a sidewall of an electromagnetic resonator of the waveguide 40.

The electronic device 1a may include stacked conductive structures 142. In some embodiments, the stacked conductive structure 142 may be disposed within the RF circuit region 10b. The stacked conductive structure 142 may include the conductive via 134 and 135 as well as the conductive trace 125.

In some embodiments, a thickness T1 of the antenna circuit region 10a may exceed a thickness T2 of the RF circuit region 10b. In some embodiments, the number of dielectric layers of the antenna circuit region 10a may exceed that of the RF circuit region 10b.

In some embodiments, the electrical connection 21 may be disposed over the surface 10s2 of the carrier 10. In some embodiments, the electrical connection 21 may be configured to electrically or signally connect to the electronic component 30. In some embodiments, the electrical connection 21 may include, for example, a solder material, such as alloys of gold and tin solder or alloys of silver and tin solder.

In some embodiments, the electrical connection 22 may be disposed over the surface 10s2 of the carrier 10. In some embodiments, the electrical connection 22 may be configured to electrically or signally connect to an external device (not shown). In some embodiments, the electrical connection 22 may include, for example, a solder material, such as alloys of gold and tin solder or alloys of silver and tin solder.

In some embodiments, the electronic component 30 may be adjacent to or disposed over the surface 10s2 of the carrier 10. The electronic component 30 may electrically connect to one or more other electrical components (if any) and to the carrier 10 (e.g., to the interconnection(s)), and the electrical connection may be attained by way of flip-chip, wire-bond techniques, metal to metal bonding (such as Cu to Cu bonding), or hybrid bonding. The electronic component 30 may be a chip or a die including a semiconductor substrate, one or more integrated circuit (IC) devices, and one or more overlying interconnection structures therein. The IC devices may include active devices such as transistors and/or passive devices such as resistors, capacitors, inductors, or a combination thereof. For example, the electronic component 30 may include a system on chip (SoC). For example, the electronic component 30 may include a radio frequency integrated circuit (RFIC), an application-specific IC (ASIC), a central processing unit (CPU), a microprocessor unit (MPU), a graphics processing unit (GPU), a microcontroller unit (MCU), a field-programmable gate array (FPGA), or another type of IC. In some embodiments, the electronic component 30 may be configured to provide the waveguide 40 with a signal (e.g., a feed signal).

In some embodiments, the waveguide 40 may be configured to radiate an electromagnetic wave, such as an RF signal. In some embodiments, the waveguide 40 may include or be made of a conductive structure, such as copper (Cu), tungsten (W), ruthenium (Ru), iridium (Ir), nickel (Ni), osmium (Os), ruthenium (Rh), aluminum (Al), molybdenum (Mo), cobalt (Co), alloys thereof, combinations thereof or any metallic materials.

In some embodiments, the waveguide 40 may include a slot waveguide antenna. In some embodiments, the waveguide 40 may include an electromagnetic resonator (not annotated), which may be defined by the stacked conductive structures 141 and slots 121o. In some embodiments, the waveguide 40 may be defined by the conductive traces 121 and 124 as well as the stacked conductive structures 141. The conductive traces 121 and 124 as well as the stacked conductive structures 141 may form a circuit structure (e.g., 15) defining at least a portion of the waveguide 40. In some embodiments, the circuit structure 15 may be configured to define a waveguide which includes an electromagnetic resonant (not annotated). In some embodiments, the circuit structure 15 may include an antenna (not annotated), which may include slots (e.g., 121o). The circuit structure 15 may include dielectric layers 111, 112, and 113, conductive traces 121 and 124, as well as conductive vias 131, 132, and 133.

In other embodiments, the antenna circuit region 10a, the RF circuit region 10b, and an antenna which include slots 121o may be regarded as another circuit structure (not annotated).

Figure 1B:
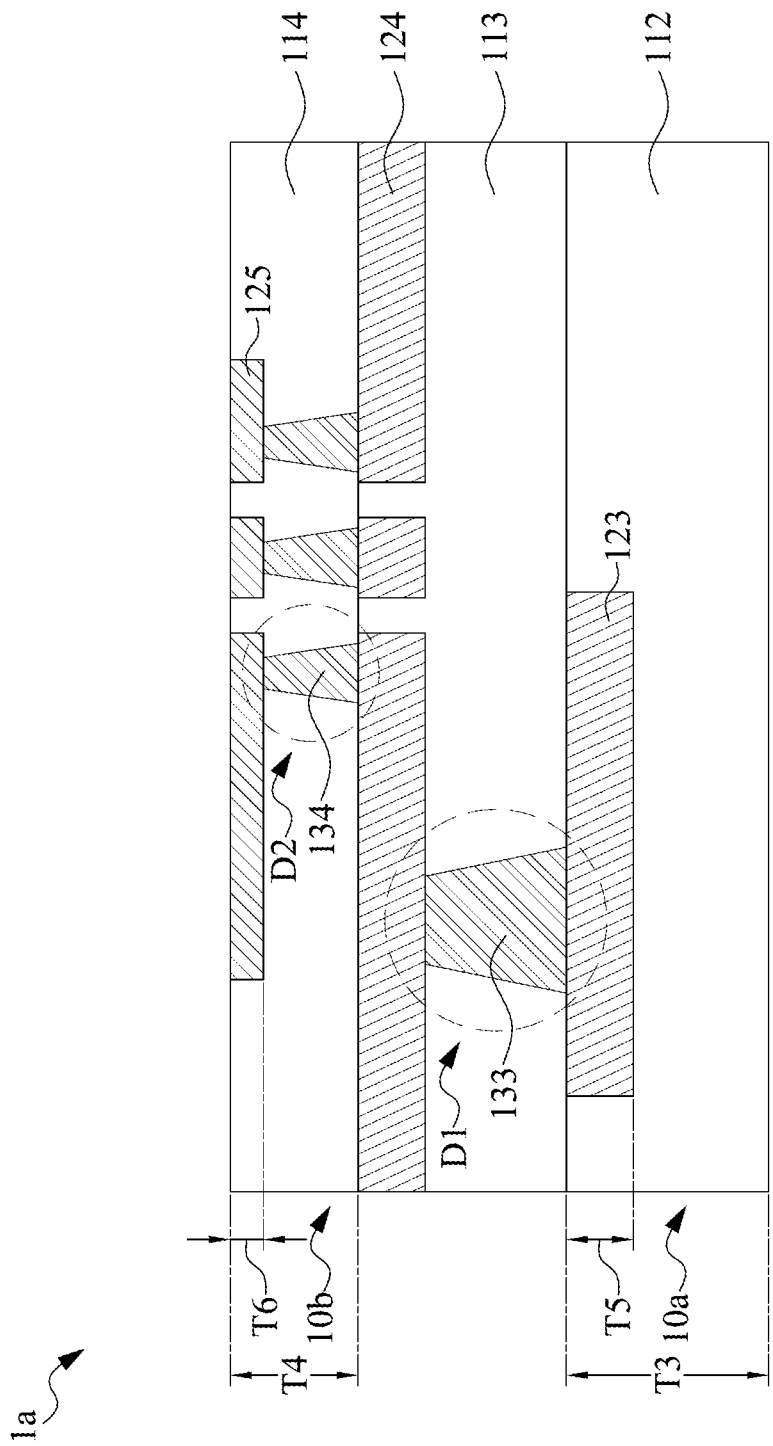
FIG. 1B is a partial enlarged view of the electronic device as shown in FIG. 1A, in accordance with an embodiment of the present disclosure.

FIG. 1B is a partial enlarged view of the electronic device 1a as shown in FIG. 1A, in accordance with an embodiment of the present disclosure.

In some embodiments, the conductive element(s) within the antenna circuit region 10a (e.g., conductive traces 121, 122, 123, and 124 as well as conductive vias 131, 132, and 133) may have a circuit density different from the conductive element(s) within the RF circuit region 10b (e.g., conductive traces 125 and 126 as well as conductive vias 134 and 135). In some embodiments, the circuit density within the antenna circuit region 10a may be less than that of the RF circuit region 10b. In this disclosure, the term "circuit density" of a conductive element (e.g., conductive pad, trace, via, layer, or other interconnections) may refer to the number of conductive pads, traces, vias, or layers, separated from each other, per unit area. In this disclosure, the circuit density of conductive elements may be inversely proportional to a pitch of the conductive elements. In this disclosure, the circuit density of conductive elements may be inversely proportional to a minimum distance of two abutting conductive pads, traces, vias, or layers of the conductive elements.

In some embodiments, a thickness of the dielectric layer of the antenna circuit region 10a may exceed that of the dielectric layer of the RF circuit region 10b. For example, the dielectric layer 112 of the antenna circuit region 10a may have a thickness T3, and the dielectric layer 114 of the RF circuit region 10b may have a thickness T4 less than the thickness T3 of the dielectric layer 112.

In some embodiments, a dimension of the conductive element of the antenna circuit region 10a (e.g., conductive traces 121, 122, 123, and 124 as well as conductive vias 131, 132, and 133) may exceed the conductive element of the RF circuit region 10b (e.g., conductive traces 125 and 126 as well as conductive vias 134 and 135). For example, a dimension D1 of the conductive via 133 may exceed a dimension D2 of the conductive via 134.

In some embodiments, a thickness of the conductive element of the antenna circuit region 10a (e.g., conductive traces 121, 122, 123, and 124 as well as conductive vias 131, 132, and 133) may exceed the conductive element of the RF circuit region 10b (e.g., conductive traces 125 and 126 as well as conductive vias 134 and 135). For example, a thickness T5 of the conductive trace 123 may exceed a thickness T6 of the conductive trace 125.

In this embodiment, the electronic device 1a may have a high-density circuit region (e.g., RF circuit region 10b) and a low-density circuit region (e.g., antenna circuit region 10a). The conductive elements in the high-density circuit region (e.g., conductive traces 125 and 126 as well as conductive vias 134 and 135) may have a relatively small dimension, which may facilitate impedance matching so that an electromagnetic signal radiating from the waveguide (e.g., waveguide 40) may have relatively large bandwidth. The conductive elements in the low-density circuit region (e.g., conductive traces 121, 122, 123, and 124 as well as conductive vias 131, 132, and 133) may have a relatively large dimension, which may provide a better shielding environment so that loss of the resonant energy within the waveguide can be reduced. The conductive elements in the low-density circuit region may form a low-density circuit. The conductive elements in the high-density circuit region may form a high-density circuit. Further, the electronic component 30 may provide the waveguide 40 (or antenna)

with an RF signal through the high-density circuit and the low-density circuit in order. For example, the RF signal may be transmitted to the high-density circuit from the electronic component 30 at first. Next, the RF signal may be transmitted to the low-density circuit from the high-density circuit. As a result, the performance of the electronic device 1a may be enhanced.

Figure 2B:
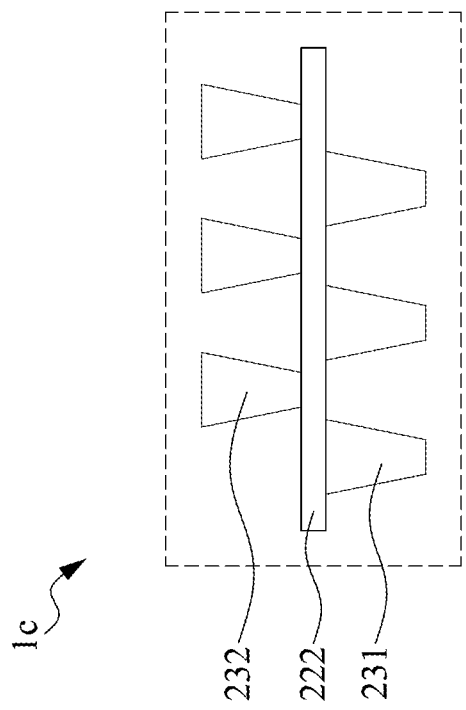
FIG. 2B is a schematic view illustrating a locational relationship between conductive vias at different levels of an electronic device, in accordance with an embodiment of the present disclosure.
Figure 2A:
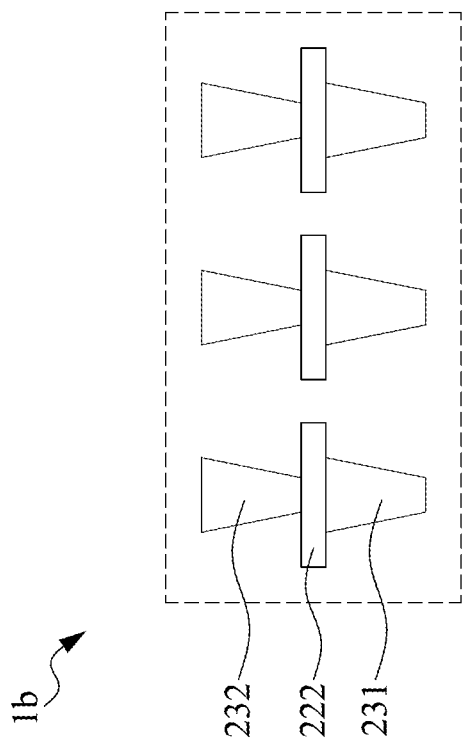
FIG. 2A is a schematic view illustrating a locational relationship between conductive vias at different levels of an electronic device, in accordance with an embodiment of the present disclosure.

FIG. 2A is a schematic view illustrating a locational relationship between conductive vias at different levels of an electronic device 1b, in accordance with an embodiment of the present disclosure.

In some embodiments, the electronic device 1b may include a conductive via 231, conductive via 232, and conductive trace 222. The conductive vias 231 and 232 may be located at different levels or elevations. In some embodiments, the conductive vias 231 and 232 may correspond to a part of the conductive vias 131, 132, 133, 134, and 135 of the electronic device 1a as shown in FIG. 1A. In some embodiments, the conductive vias 231 and 232 may serve as ground vias which are electrically connected to ground. In some embodiments, the conductive trace 222 may function as a ground layer, which is electrically connected to ground. The conductive via 232 may be stacked over the conductive via 231. The conductive trace 222 may be disposed between the conductive vias 231 and 232. In some embodiments, the conductive trace 222 may correspond to a part of the conductive traces 122, 123, 124, and 125 of the electronic device 1a as shown in FIG. 1A.

In some embodiments, the conductive via 231 may be vertically aligned with the conductive via 232. In some embodiments, the conductive via 231 may vertically overlap the conductive via 232. In some embodiments, the conductive vias 231 and 232 may serve as a sidewall of an electromagnetic resonator of a waveguide, and such design may reduce the loss of the resonant energy within the waveguide.

FIG. 2B is a schematic view illustrating a locational relationship between conductive vias at different levels of an electronic device 1c, in accordance with an embodiment of the present disclosure. The electronic device 1c is similar to the electronic device 1b as shown in FIG. 2A, with differences therebetween as follow.

In some embodiments, the conductive vias 231 and 232 may have a staggered arrangement. In some embodiments, the conductive via 231 may be vertically free from overlapping the conductive via 232. In other embodiments, the conductive via 231 may vertically partially overlap the conductive via 232. In some embodiments, the conductive vias 231 and 232 may serve as a sidewall of an electromagnetic resonator of a waveguide, and such design may further reduce the loss of the resonant energy within the waveguide.

Figure 3A:
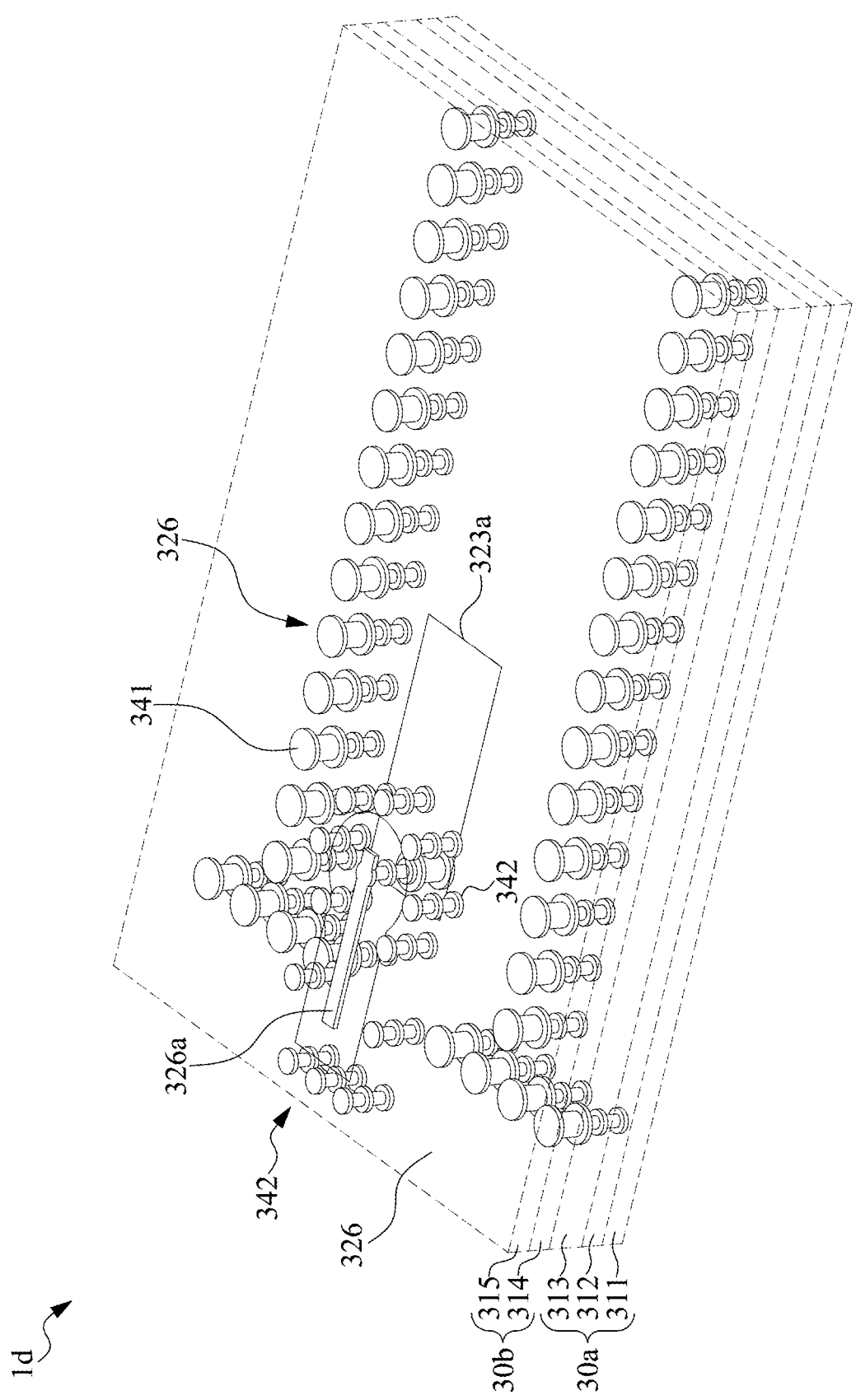
FIG. 3A is a perspective view of an electronic device, in accordance with an embodiment of the present disclosure.

FIG. 3A is a perspective view of an electronic device 1d, in accordance with an embodiment of the present disclosure.

The electronic device 1d may include an antenna circuit region 30a (or antenna region) and an RF circuit region 30b. The antenna circuit region 30a may define a waveguide (not annotated) and include at least a part of an electromagnetic resonator (not annotated). The RF circuit region 30b may be configured to transmit a signal (e.g., a feed signal) to the antenna circuit region 30a.

In some embodiments, the electronic device 1d may include dielectric layers 311, 312, 313, 314, and 315, which may correspond to the dielectric layers 111, 112, 113, 114, and 115 of the electronic device 1a as shown in FIG. 1A, respectively.

The electronic device 1d may include a conductive trace 326, which may correspond to the conductive trace 126 of the electronic device 1a as shown in FIG. 1A. The electronic device 1d may include stacked conductive structures 341, which may include a plurality of conductive traces and conductive vias located within the dielectric layers 311, 312, and 313. The stacked conductive structure 341 may correspond to the stacked conductive structure 141 of the electronic device 1a as shown in FIG. 1A. The stacked conductive structures 341 may be configured to define an electromagnetic resonator of a waveguide. The electronic device 1d may include stacked conductive structures 342, which may include a plurality of conductive traces and conductive vias located within the dielectric layers 314 and 315. The stacked conductive structure 342 may correspond to the stacked conductive structure 142 of the electronic device 1a as shown in FIG. 1A. The dimension of the conductive elements of the stacked conductive structure 341 may be greater than the dimension of the conductive elements of the stacked conductive structure 342.

In some embodiments, the electronic device 1d may include a feed element 326a. The feed element 326a may be located at a level the same as that of the conductive trace 326. The feed element 326a may be configured to transmit a signal (e.g., a feed signal).

In some embodiments, the electronic device 1d may include an impedance matching element 323a. In some embodiments, the impedance matching element 323a may be located within the dielectric layer 312 and located at a level the same as that of the conductive trace 123 of the electronic device 1a as shown in FIG. 1A. In some embodiments, the impedance matching element 323a may be electrically connected to the feeding element 326a. In some embodiments, the impedance matching element 323a may be configured to compensate a mismatch of impedances between the antenna circuit region 30a and RF circuit region 30b. In some embodiments, the impedance matching element 323a may be configured to compensate a mismatch of impedances between the conductive elements within the antenna circuit region 30a and RF circuit region 30b. In some embodiments, the impedance matching element 323a may function as an exciter of an electromagnetic wave radiated from a waveguide of the antenna circuit region 30a. In some embodiments, the impedance matching element 323a may be configured to radiate an electromagnetic wave.

Figure 3B:
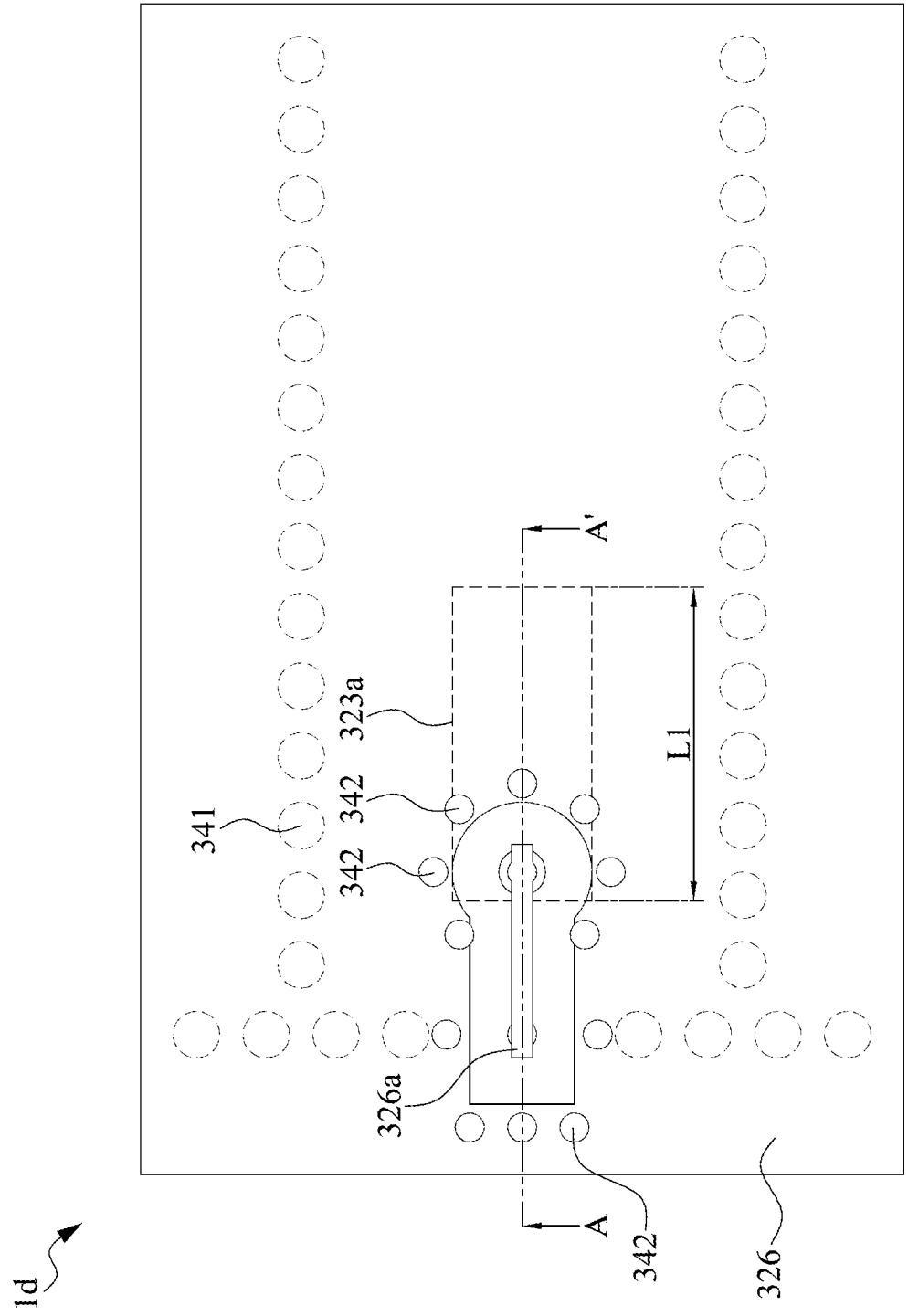
FIG. 3B is a top view of a partial layout of the electronic device as shown in FIG. 3A, in accordance with an embodiment of the present disclosure.

FIG. 3B is a top view of a partial layout of the electronic device 1d as shown in FIG. 3A, in accordance with an embodiment of the present disclosure.

In some embodiments, the impedance matching element 323a may overlap the feed element 326a. In some embodiments, the impedance matching element 323a may overlap the stacked conductive structure 342 from a top view. In some embodiments, the impedance matching element 323a may be at least partially surrounded by the stacked conductive structure 341 from a top view. In some embodiments, the impedance matching element 323a may have a length L1 along the arrangement of the stacked conductive structure 341. In some embodiments, the length L1 of the impedance matching element 323a may range from about 0.25 times to about 0.5 times of the wavelength of a signal radiating from the waveguide of the antenna circuit region 30a.

Figure 3C:
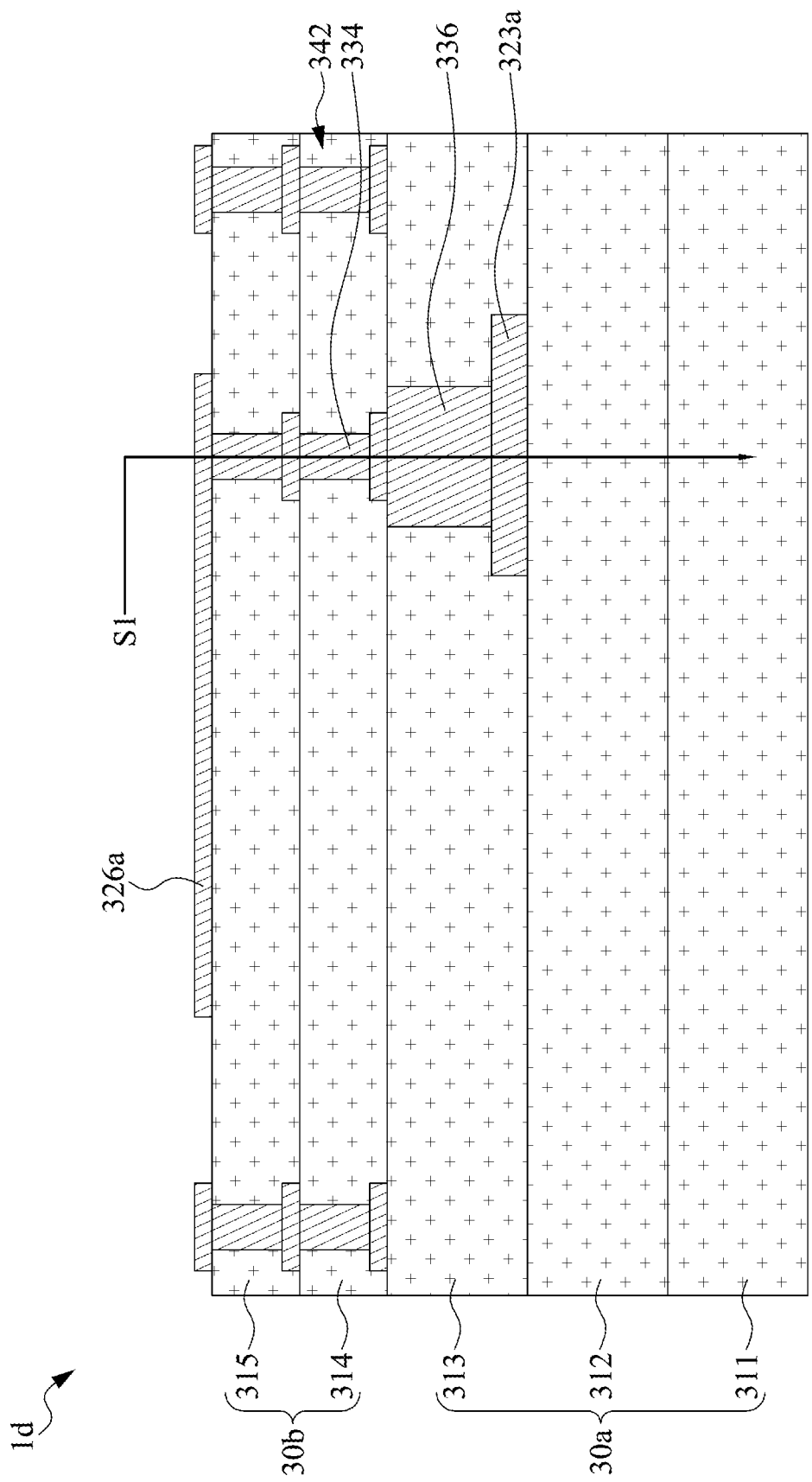
FIG. 3C is a cross-sectional view along line A-A' of the electronic device as shown in FIG. 3B, in accordance with an embodiment of the present disclosure.

FIG. 3C is a cross-sectional view along line A-A' of the electronic device 1d as shown in FIG. 3B, in accordance with an embodiment of the present disclosure.

In some embodiments, the electronic device 1d may include conductive vias 334 and 336 (or conductive elements). The conductive via 334 may be located within the dielectric layer 314. The conductive via 334 may correspond to the conductive via 134 of the electronic device 1a as shown in FIG. 1A and have a relatively small dimension. The conductive vias of the stacked conductive structures 342 may be configured to reduce an interference of an electromagnetic wave, which may adversely affect the conductive via 334. The conductive via 336 may be located within the dielectric layer 313. The conductive via 336 may be located at a level the same as that of the conductive via 133 of the electronic device 1a as shown in FIG. 1A and have a relatively large dimension.

In some embodiments, the feed element 326a may be configured to transmit a signal S1 (e.g., a feed signal) to the antenna circuit region 30a. In some embodiments, the feed element 326a may be configured to transmit the signal S1 to the impedance matching element 323a through the conductive vias 334 and 336. Since the conductive vias 334 and 336 have different dimensions, the conductive vias 334 and 336 have different impedances. The mismatch of the impedances between the antenna circuit region 30a and the RF circuit region 30b may result in a deviation of an electromagnetic wave radiating from the electronic device 1d. In some embodiments, the impedance matching element 323a may be located within the antenna circuit region 30a. The impedance matching element 323a may abut the conductive via 336. The impedance matching element 323a may be located within the waveguide, which may be defined by the stacked conductive structures 341. In some embodiments, the impedance matching element 323a may be configured to compensate the mismatch of the impedances between the conductive elements (e.g., 333 and 336) within the antenna circuit region 30a and the RF circuit region 30b. Therefore, the deviation of the electromagnetic wave radiating from the electronic device 1d may be corrected.

Figure 4A:
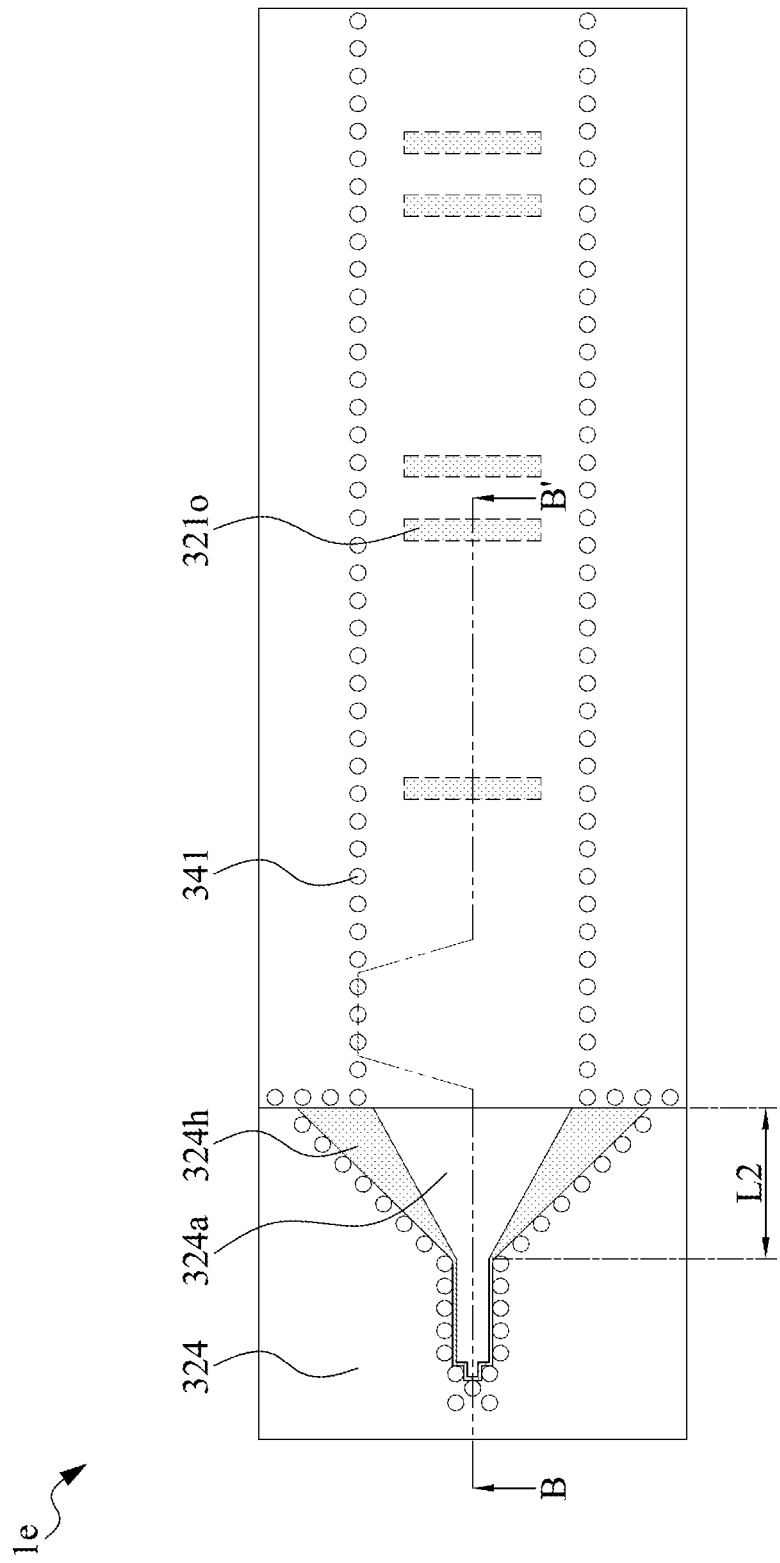
FIG. 4A is a top view of a partial layout of an electronic device, in accordance with an embodiment of the present disclosure.

FIG. 4A is a top view of a partial layout of an electronic device 1e, in accordance with an embodiment of the present disclosure.

In some embodiments, the electronic device 1e may include a conductive trace 324. The conductive trace 324 may function as a grounding layer and correspond to the conductive trace 124 of the electronic device 1a as shown in FIG. 1A. The electronic device 1e may include slots 321o. The slots 321o may function as a part of an electromagnetic resonator and correspond to the slots 121o as shown in FIG. 1A.

In some embodiments, the conductive trace 324 may define an impedance matching element 324a. In some embodiments, the impedance matching element 324a may have a tapered profile. In some embodiments, the impedance matching element 324a may have a length L2 along the arrangement of the stacked conductive structures 341. In some embodiments, the length L2 of the impedance matching element 324a may range from about 0.25 times to about 0.5 times of the wavelength of a signal radiating from the waveguide of the antenna circuit region 30a. In some embodiments, the impedance matching element 324a may be at least partially surrounded by the stacked conductive structures 341 from a top view. In some embodiments, the impedance matching element 324a may be free from vertically overlapping the slots 321o from a top view. In some embodiments, a hollow pattern 324h of the conductive trace 324 may be located between the impedance matching element 324a and the stacked conductive structures 341.

Figure 4B:
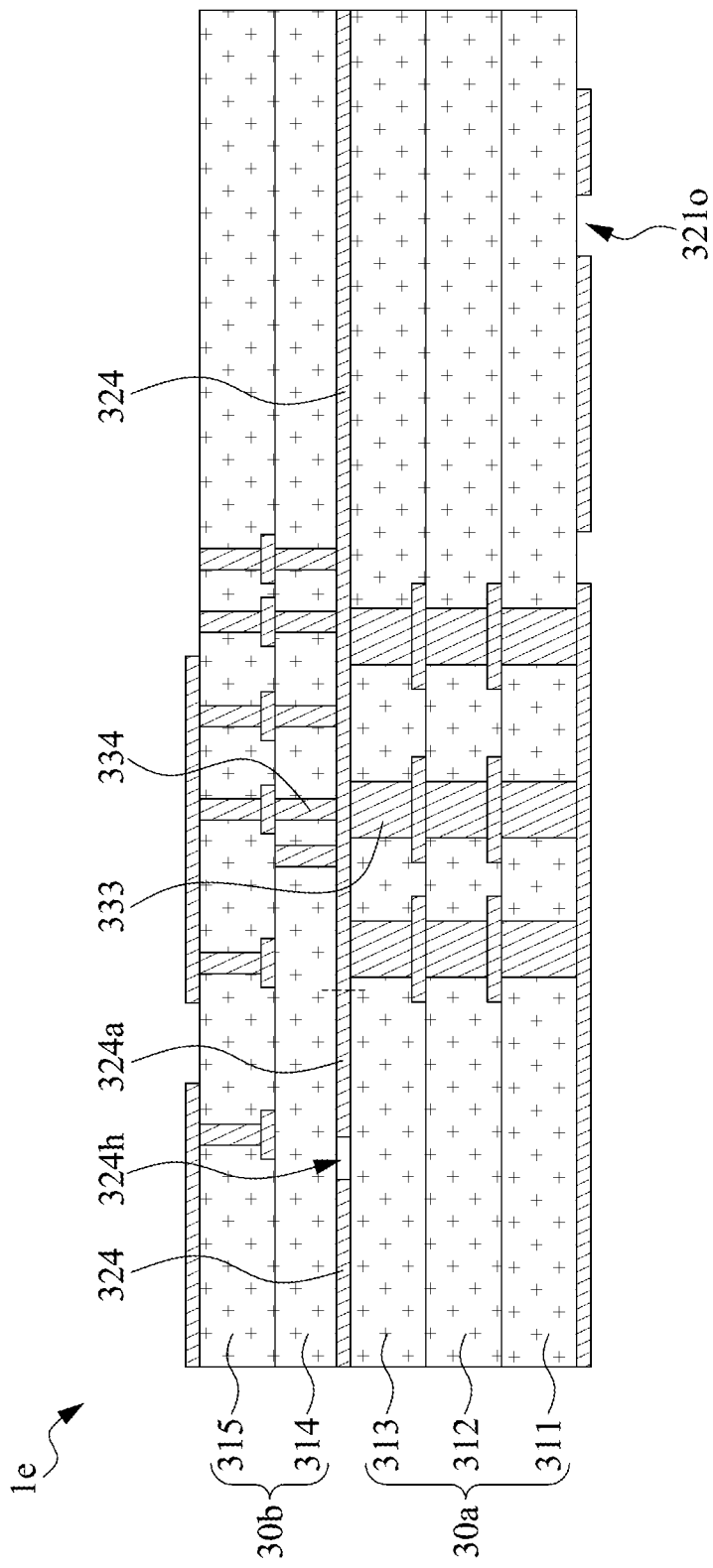
FIG. 4B is a cross-sectional view along line B-B' of the electronic device as shown in FIG. 4A, in accordance with an embodiment of the present disclosure.

FIG. 4B is a cross-sectional view along line B-B' of the electronic device as shown in FIG. 4A, in accordance with an embodiment of the present disclosure.

In some embodiments, the impedance matching element 324a may be defined by the conductive trace 324. In some embodiments, the impedance matching element 324a may be configured to compensate the mismatch of the impedances between the conductive elements (e.g., 333 and 334) within the antenna circuit region 30a and the RF circuit region 30b. Therefore, the deviation of the electromagnetic wave radiating from the electronic device 1d may be corrected. Further, an additional conductive via, such as the conductive via 336 as shown in FIG. 3C, can be omitted.

Figure 5:
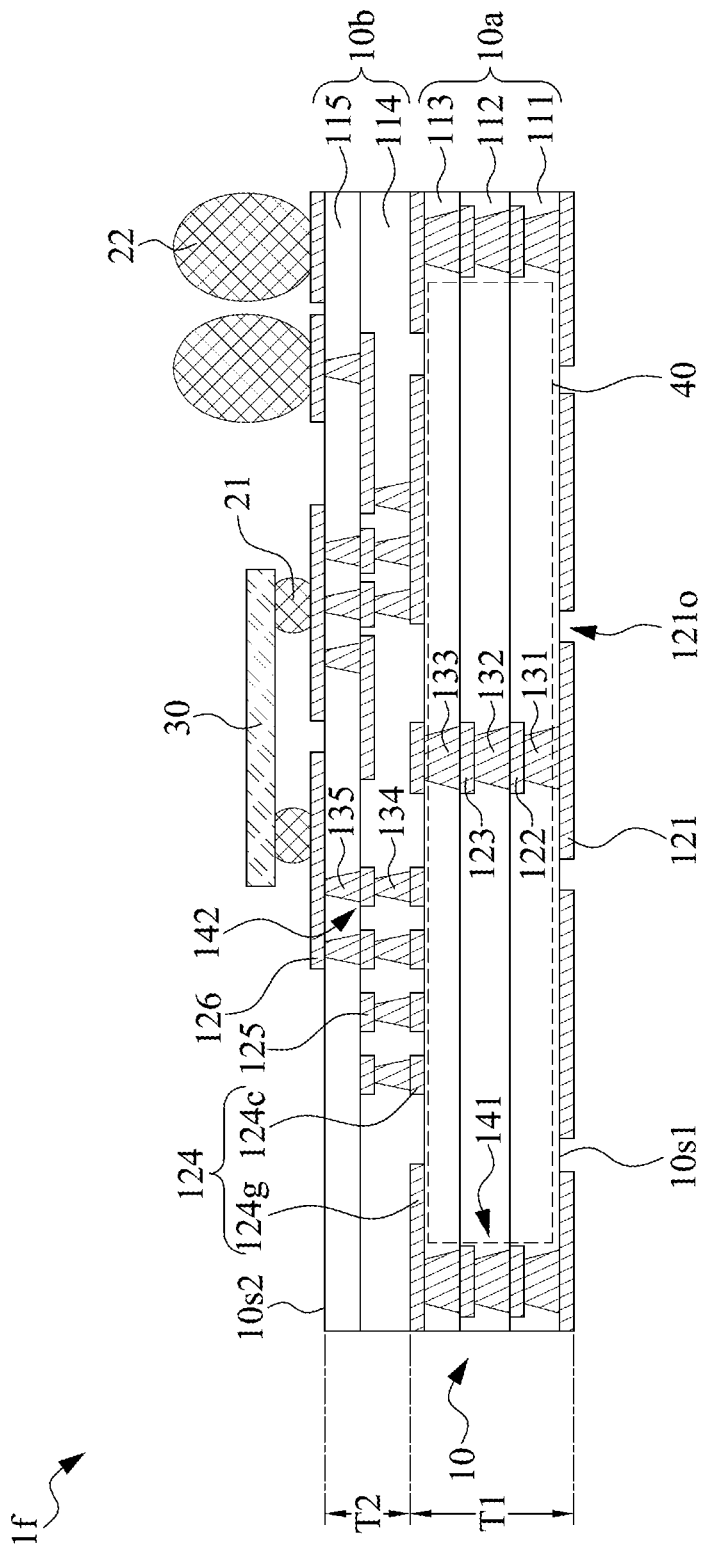
FIG. 5 is a cross-sectional view of an electronic device, in accordance with an embodiment of the present disclosure.

FIG. 5 is a cross-sectional view of an electronic device 1f, in accordance with an embodiment of the present disclosure. The electronic device 1f is similar to the electronic device 1a as shown in FIG. 1A, with differences therebetween as follow.

In some embodiments, the circuit density of the stacked conductive structure 142 may be greater than that of the stacked conductive structure 141. In some embodiments, the circuit density of the conductive vias 134 (or 135) may be greater than that of the conductive vias 133 (or 131 or 132). In some embodiments, the circuit density of the layer 124c may be greater than that of the conductive trace 123.

Figure 6:
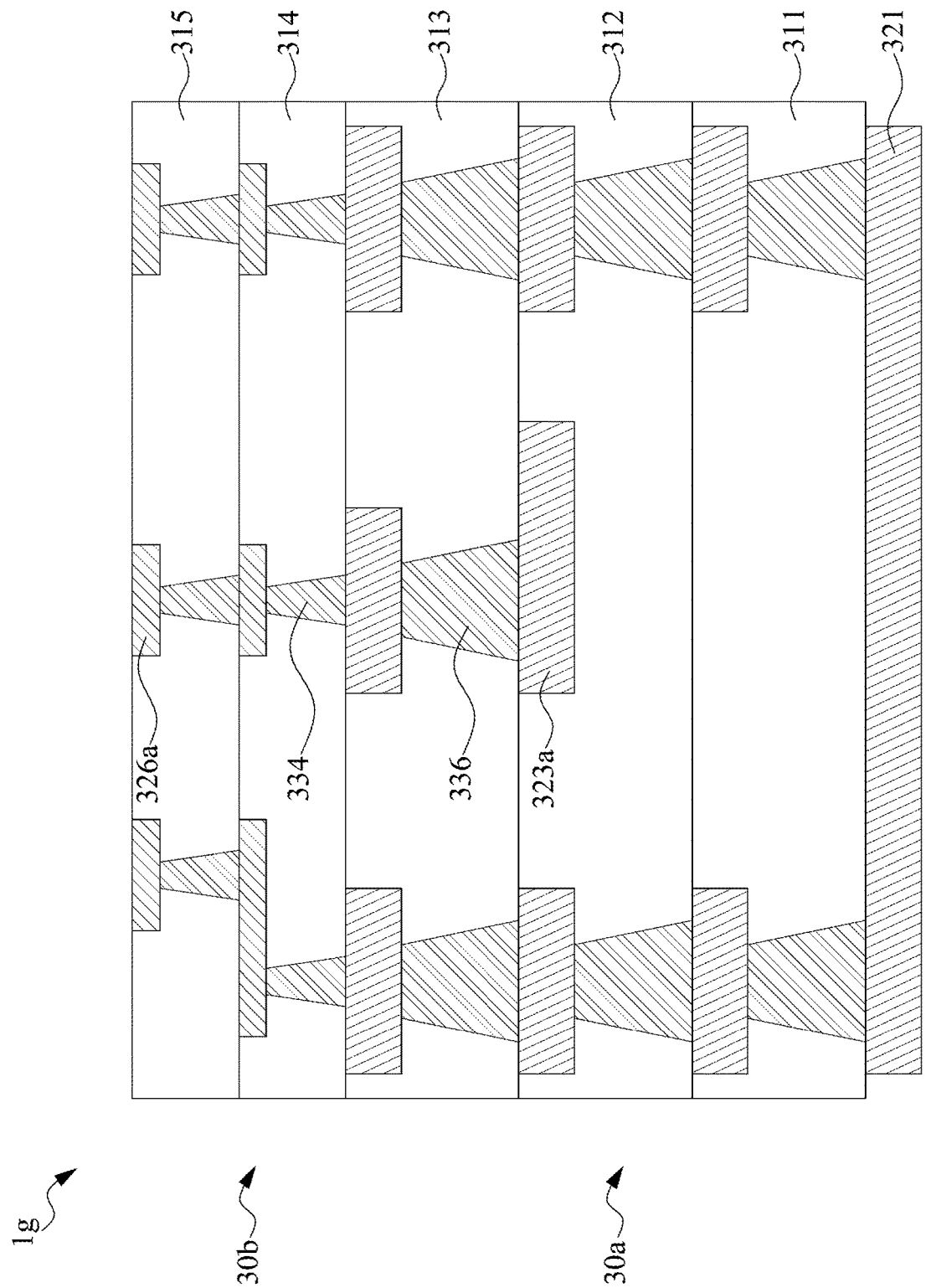
FIG. 6 is a cross-sectional view of an electronic device, in accordance with an embodiment of the present disclosure.

FIG. 6 is a cross-sectional view of an electronic device 1g, in accordance with an embodiment of the present disclosure. The electronic device 1g is similar to the electronic device 1d as shown in FIG. 3C, with differences therebetween as follow.

In some embodiments, the electronic device 1g may include a conductive trace 321 disposed over a lower surface of the dielectric layer 311. The conductive trace 321 may be configured to define slots (not shown). In some embodiments, the conductive element 334 may be tapered along a direction from the dielectric layer 311 toward the dielectric layer 315. In some embodiments, the conductive element 336 may be tapered along a direction from the dielectric layer 311 toward the dielectric layer 315. In some embodiments, the conductive element 326a may be embedded within the dielectric layer 315. In some embodiments, the impedance matching element 323a may be disposed within the dielectric layer 312 and located within the antenna region 30a.

Spatial descriptions, such as "above," "below," "up," "left," "right," "down," "top," "bottom," "vertical," "horizontal," "side," "higher," "lower," "upper," "over," "under," and so forth are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a radio frequency (RF) circuit region having a first circuit density;
an antenna region comprising a circuit structure defining a waveguide, wherein the circuit structure has a second circuit density less than the first circuit density,
wherein the RF circuit region has a first conductive element, the antenna region has a second conductive element disposed within the waveguide and connected to the first conductive element; and
an impedance matching element configured to compensate a mismatch of impedances caused by the first conductive element and the second conductive element.

2. The electronic device of claim 1, wherein the RF circuit region comprises a first dielectric layer, the antenna region comprises a second dielectric layer, and a thickness of the first dielectric layer is less than a thickness of the second dielectric layer.

3. The electronic device of claim 1, wherein a thickness of the antenna region is greater than a thickness of the RF circuit region.

4. The electronic device of claim 1, wherein the RF circuit region comprises a first conductive trace, the antenna region comprises a second conductive trace, and a thickness of the first conductive trace is less than a thickness of the second conductive trace.

5. The electronic device of claim 1, wherein the circuit structure comprises a plurality of first conductive vias and a plurality of second conductive vias disposed above the plurality of first conductive vias, and the plurality of first conductive vias and the plurality of second conductive vias are configured to reduce a loss of an energy of an electromagnetic wave within the waveguide.

6. The electronic device of claim 5, wherein at least one of plurality of second conductive vias is stacked over at least one of plurality of first conductive vias in a cross sectional view.

7. The electronic device of claim 5, wherein the plurality of second conductive vias and the plurality of first conductive vias are staggered in a cross sectional view.

8. The electronic device of claim 1, wherein the first conductive element has a first diameter, and the second conductive element has a second diameter greater than the first diameter.

9. The electronic device of claim 1, wherein the impedance matching element abuts the second conductive element.

10. The electronic device of claim 9, wherein the impedance matching element is located within the waveguide.

11. The electronic device of claim 9, wherein the first conductive element is electrically connected to the impedance matching element through the second conductive element.

12. The electronic device of claim 1, wherein the impedance matching element is configured to radiate an electromagnetic wave.

13. The electronic device of claim 1, wherein the RF circuit region comprises a plurality of conductive vias abutting the first conductive element, wherein the plurality of conductive vias are configured to reduce an interference of an electromagnetic wave to the first conductive element.

14. The electronic device of claim 13, wherein at least one of the plurality of conductive vias overlaps the impedance matching element from a top view.

15. An electronic device, comprising:
a radio frequency (RF) circuit region having a first circuit density;
an antenna region comprising an antenna and a circuit structure defining a waveguide, wherein the circuit structure has a second circuit density less than the first circuit density; and
an electronic component disposed under the RF circuit region and configured to provide an RF signal to the antenna through the RF circuit region and the circuit structure.

16. The electronic device of claim 15, wherein the RF signal passes through the RF circuit region and the circuit structure in sequence.

17. The electronic device of claim 15, wherein the RF circuit region is disposed between the electronic component and the circuit structure.

18. The electronic device of claim 15, wherein the antenna region comprises an impedance matching element within the waveguide.

19. The electronic device of claim 15, wherein the circuit structure comprises a plurality of slots functioning as a part of the antenna.

* * * * *